(12) United States Patent
Mizutani

(10) Patent No.: US 7,738,615 B2
(45) Date of Patent: Jun. 15, 2010

(54) SAMPLING FREQUENCY CONVERSION APPARATUS AND SIGNAL SWITCHING APPARATUS

(75) Inventor: Tomoji Mizutani, Kanagawa (JP)

(73) Assignee: Sony Corporation, Tokyo (JP)

( * ) Notice: Subject to any disclaimer, the term of this patent is extended or adjusted under 35 U.S.C. 154(b) by 779 days.

(21) Appl. No.: 11/595,129

(22) Filed: Nov. 9, 2006

(65) Prior Publication Data

US 2007/0110203 A1 May 17, 2007

(30) Foreign Application Priority Data

Nov. 14, 2005 (JP) ............................ P2005-329068

(51) Int. Cl.
*H04L 7/04* (2006.01)
*H03M 7/00* (2006.01)

(52) U.S. Cl. ........................ 375/362; 375/354; 341/61

(58) Field of Classification Search ................ 375/354, 375/355, 356, 362, 371, 373, 375; 341/61
See application file for complete search history.

(56) References Cited

U.S. PATENT DOCUMENTS

| 5,585,794 | A * | 12/1996 | Airoldi et al. .................. 341/61 |
| 2002/0122518 | A1 | 9/2002 | Yasuda et al. |
| 2002/0190880 | A1* | 12/2002 | McLaughlin et al. .......... 341/61 |
| 2004/0120361 | A1 | 6/2004 | Yu et al. |
| 2005/0033586 | A1 | 2/2005 | Savell |

FOREIGN PATENT DOCUMENTS

| JP | 2002 158619 | 5/2002 |
| WO | WO 2004 086614 | 10/2004 |

OTHER PUBLICATIONS

Anonymous: "AD1896: 192 KHz Stereo Asynchronous Sample Rate Converter" Analog Devices Data Sheet, [Online] 2003, XP002517952 Retreived from the Internet: URL:http://www.analog.com/static/imported-files/data_sheets/AD1896.PDF>.

* cited by examiner

*Primary Examiner*—Shuwang Liu
*Assistant Examiner*—David Huang
(74) *Attorney, Agent, or Firm*—Frommer Lawrence & Haug LLP; William S. Frommer; Thomas F. Presson

(57) ABSTRACT

A sampling frequency conversion apparatus having sampling frequency conversion circuits for a plurality of channels includes a detector detecting phase information of digital signals inputted to the conversion circuit for each channel, and an input section inputting setting information for the conversion circuits for two or more channels to be phase-synchronized. The apparatus further includes a phase information supplier supplying the phase information for the conversion circuit for a specific channel designated by the setting information inputted into the input section to the conversion circuits for the remaining channels of those for two or more channels other than the conversion circuit for the specific channel, and a sampling frequency converter performing sampling frequency conversion on the phase information of the conversion circuits for the remaining channels in synchronization with the phase information for the specific channel supplied from the phase information supplier.

9 Claims, 10 Drawing Sheets

FIG. 9

| ENABLE SAMPLE RATE CONVERTOR | | | | | | | | | | | IXS-6700 | | | | V1.00 | | STATION NUMBER 1 | |
|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 |
| INPUT | | | | | | | | | | | | | | | | | |
| SLOT3 | ( 1– 16) | *==*=*= | | | | | | | | | | | | | | | |
| SLOT3 | ( 17– 32) | | ==*= | | | | | | | | | | | | | | |
| SLOT4 | ( 33– 48) | | | *= | | | | | | | | | | | | | |
| SLOT4 | ( 49– 64) | | | | *==*=* | | | | | | | | | | | | |
| SLOT7 | ( 65– 80) | | | | | *= | | | | | | | | | | | ==*== |
| SLOT7 | ( 81– 96) | | | | | | *= | | | | | | | | | | |
| SLOT8 | ( 97–112) | | | | | | | *= | | | | | | | | | |
| SLOT8 | (113–128) | | | | | | | | *= | | | | | | | | |
| SLOT11 | (129–144) | | | | | | | | | *= | | | | | | | |
| SLOT11 | (145–160) | | | | | | | | | | *= | | | | | | |
| SLOT12 | (161–176) | | | | | | | | | | *= | ==*== | | | | | |
| SLOT12 | (177–192) | | | | | | | | | | | | *= | | | | |
| SLOT15 | (193–208) | | | | | | | | | | | | | | | | |
| SLOT15 | (209–224) | | | | | | | | | | | | | | | | |
| SLOT16 | (225–240) | | | | | | | | | | | | | | | | |
| SLOT16 | (241–256) | | | | | | | | | | | | | | | | |
| | | SLOT3 | SLOT4 | SLOT7 | SLOT8 | SLOT8 | | SLOT11 | | SLOT12 | | SLOT15 | | SLOT16 | | |
| FREQ | | 48 | 48 | 48 | 48 | 48 | | 48 | | 192 | | 96 | | 96 | | |
| F1:PgUp | F2:PgDn | | | | | | | | | S:Table Set | | Ctrl-E:RETURN TO MENU | | | | | |

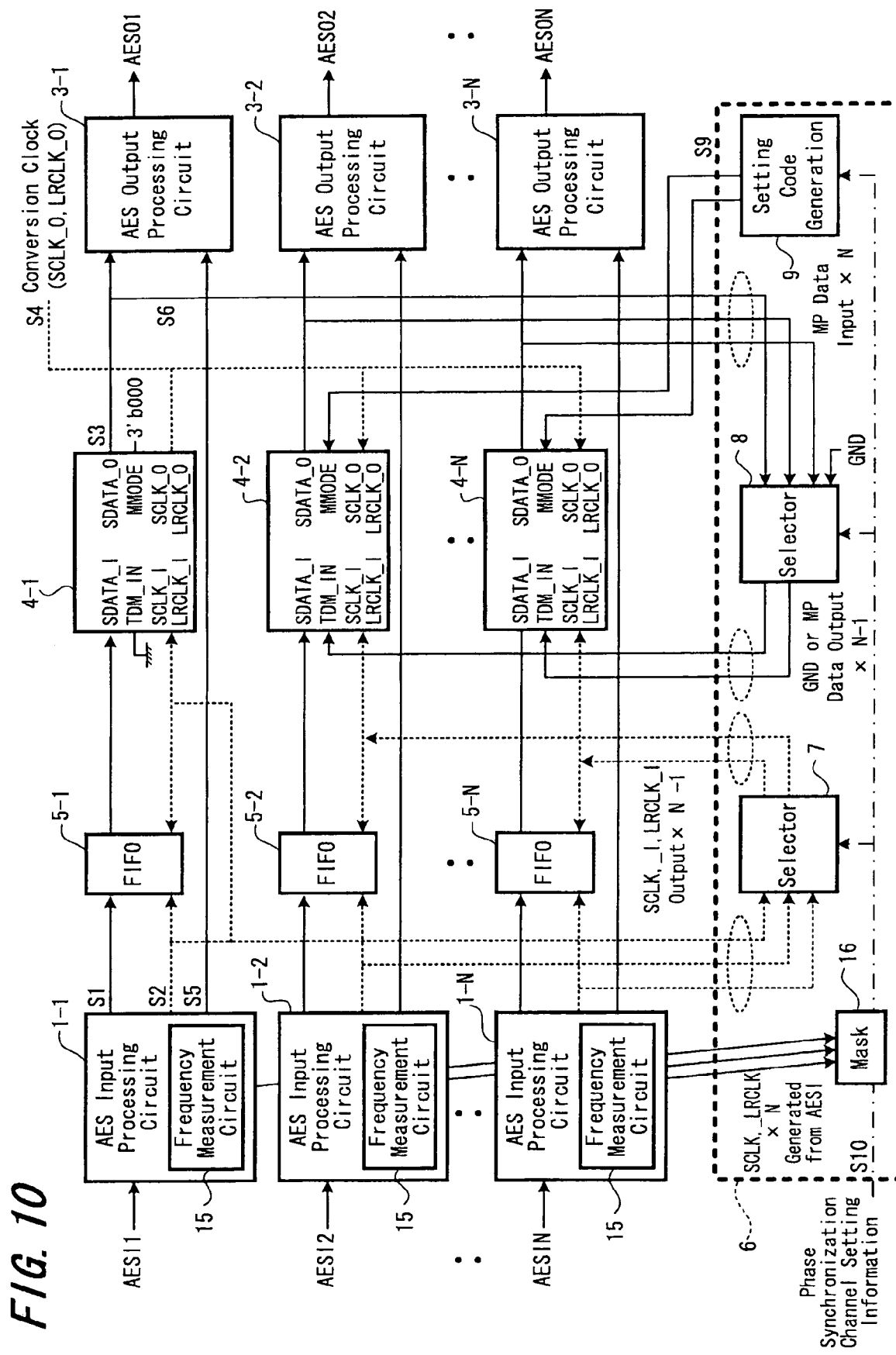

SAMPLING FREQUENCY CONVERSION APPARATUS AND SIGNAL SWITCHING APPARATUS

CROSS REFERENCES TO RELATED APPLICATIONS

The present invention contains subject matter related to Japanese Patent Application JP 2005-329068 filed in the Japanese Patent Office on Nov. 14, 2005, the entire contents of which being incorporated herein by reference.

BACKGROUND OF THE INVENTION

1. Field of the Invention

The present invention relates to a sampling frequency conversion apparatus having sampling frequency conversion circuits for a plurality of channels and a signal switching apparatus having a sampling frequency conversion circuit provided for each channel. More particularly, the present invention relates to a sampling frequency conversion apparatus and a signal switching apparatus suitable for inputting multi-channel signals of various numbers of channels.

2. Description of the Related Art

There has been developed a sampling frequency conversion apparatus (or, sample rate converter) which performs sampling frequency conversion processing on multi-channel digital audio signals.

FIG. 1 is a diagram showing one configuration example of such a sample rate converter (here, a later-described Matched-Phase mode is not applied). The sample rate converter performs sampling frequency conversion on AES/EBU formatted digital audio signals (hereinafter, referred to as "AES signals"), and includes AES input processing circuits 1-1, 1-2, 1-3; SRCs (sample rate converter IC) 2-1, 2-2, 2-3; and AES output processing circuits 3-1, 3-2, 3-3, corresponding to inputted AES signals (AESI1, AESI2, AESI3) for respective channels (hereinafter, these circuits for respective channels are generically described as "AES input processing circuit 1", "SRC 2", "AES output processing circuit 3", and the like).

The AES input processing circuit 1 includes the following circuit blocks (1) to (3):

(1) A circuit which samples clock signals based on waveforms of inputted AES signals (2) A circuit which demodulates audio data from inputted AES signals (3) A circuit which samples ancillary data such as audio channel status bits from inputted AES signals Demodulated audio data S1 and sampled clock signals S2 (SCLK_I, LRCLK_I) are supplied from the AES input processing circuit 1 to the SRC 2. Likewise, sampled ancillary data S5 are supplied from the AES input signal processing circuit 1 to the AES output processing circuit 3. FIG. 2 is a diagram showing waveforms of the clock signals SCLK_I and LRCLK_I with audio data (left channel audio data and right channel audio data) of the AES signals for one frame (1/fs period).

As shown in FIG. 1, the SRC 2 performs sampling frequency conversion on the audio data S1 using the clock signals S2 (SCLK_I, LRCLK_I) and internal sampling frequency conversion reference clock signals S4 (SCLK_O, LRCLK_O) of the apparatus. Audio data S3 on which sampling frequency conversion is performed using the SRC 2 are supplied to the AES output processing circuit 3.

The AES output processing circuit 3 converts the audio data S3 and the ancillary data S5 into original AES signals, and outputs the AES signals (AESO1, AESO2, AESO3).

There arises a problem in which sound localization (phase, balance) discords between the SRCs 2 for respective channels in the SRC 2 due to a difference in processing time delays according to the sample rate converter having the configuration in FIG. 1.

According to an embodiment of the present invention, the following methods (1), (2), and the like have generally been applied:

(1) A method that is conducted, when sampling frequency conversion is performed, using a memory unit which subsequently writes input data or data oversampling the input data, and sequentially read data written with a prescribed address difference from a write address, and using an interpolation processor which performs interpolation processing on the data read from the memory unit. In this method, the address difference between the write address and the read address of the memory unit is optimized. During a prescribed period of supplying input data, the difference between the addresses is optimized without any limitation, and after the prescribed period, the optimization is performed with a certain limitation (see Patent Reference 1).

(2) A method of setting a common parameter between the SRCs for sampling frequency conversion processing (hereinafter, referred to as "Matched-Phase mode processing" or "MP processing") (see Non-patent Reference 1).

FIG. 3 is a diagram showing one configuration example of a sample rate converter using a Matched-Phase mode processing of the methods, and the elements identical to those in FIG. 1 are provided with the same reference numerals. In this sample rate converter, an SRC 4-1 (Phase-Master) is provided to the first channel, and an SRC 4-2 (Slave 1) and an SRC 4-3 (Slave 2) are respectively provided to the second channel and the third channel, in place of the respective SRCs 2-1, 2-2 and 2-3 shown in FIG. 1.

A TDM_IN terminal of the SRC 4-1 is grounded, and a code 3'b000 (setting code indicating Phase-Master) is supplied to an MMODE terminal of the SRC 4-1. Based on the code 3'b000, the SRC 4-1 performs sampling frequency conversion on the audio data S1 supplied from the AES input processing circuit 1-1 in synchronization with a phase detected from the audio data S1. The SRC 4-1 then multiplexes detected phase information (Matched-Phase data) with the audio data on which sampling frequency conversion is performed, and outputs the multiplexed data as shown in FIG. 4. In FIG. 3, the Matched-Phase data S6 is supplied to the TDM_IN terminals of the SRC 4-2 and SRC 4-3.

A code 3'b100 (setting code indicating Slave) is supplied to MMODE terminals of the SRC 4-2 and SRC 4-3. Based on the code 3'b100, the SRC 4-2 and SRC 4-3 respectively perform sampling frequency conversion on the audio data S1 supplied from the AES input processing circuits 1-2 and 1-3 in synchronization with the Matched-Phase data S6 which is inputted into the TDM_IN terminals.

Accordingly, the SRC 4-1, SRC 4-2 and SRC 4-3 respectively operate in synchronization with the common phase (phase detected by SRC 4-1).

[Patent Reference 1] Japanese Unexamined Patent Publication No. 2002-158619 (paragraphs 0049, 0067 to 0069, FIGS. 1, 2 and 6)

[Non-patent Reference 1] "192 kHz Stereo Asynchronous Sample Rate Converter AD1896" ANALOG DEVICES, retrieved from Nov. 7, 2005, Internet <URL:http://www.analog.com/UploadedFiles/Data_Sheets/71654447AD1896_a.pdf>

SUMMARY OF THE INVENTION

The sample rate converter having a configuration shown in the FIG. 3 can exhibit sufficient phase synchronization performance provided that the phase of the audio data inputted into the SRC 4-1 mutually matches with the phase of the audio data inputted into the SRCs 4-2 or 4-3. However, if these phases discord therebetween (for example, if lengths of AES signal AESI1 transmission cable and AES signal AESI2 or AESI3 transmission cable differ, or if a processing time delays between the AES input processing circuits 1 differ), sufficient phase synchronization performance may not be obtained, because the sampling frequency conversion is performed on the audio data having the mutually deviated phases in synchronization with the common phase.

FIG. 5 is a diagram showing one configuration example of a sample rate converter having an improvement on that point, and the elements identical to those in FIG. 3 are provided with the same reference numerals. FIFO memories 5-1, 5-2, and 5-3 are provided at preceding stages of the respective SRCs 4-1, 4-2, and 4-3.

The clock signals S2 (SCLK_I, LRCLK_I) sampled at the AES input processing circuits 1-1, 1-2, and 1-3 are supplied to the respective FIFO memories 5-1, 5-2 and 5-3 as write clock signals.

Similarly, the clock signals S2 (SCLK_I, LRCLK_I) sampled at the AES input processing circuit 1-1 are supplied to the FIFO memories 5-1, 5-2, and 5-3 as read clock signals.

The clock signals S2 (SCLK_I, LRCLK_I) sampled at the AES input processing circuit 1-1 are also supplied to the SRCs 4-1, 4-2, and 4-3.

The FIFO memories 5 have respective functions such that the phases of the audio data inputted into respective SRCs 4 are aligned by mitigating a phase difference owing to cable lengths for respective channels and processing time delays for the respective AES input processing circuits 1.

FIG. 6 is a diagram showing operation timing of the FIFO memories 5. Three columns at the upper side of the figure show timing at which the respective FIFO memories 5-1, 5-2, and 5-3 respectively write the audio data for respective frames detected from the AES signals AESI1, AESI2, and AESI3. The FIFO memories 5-1, 5-1, and 5-3 write the input audio data at an inputting timing of audio data.

Three columns at the lower side of the figure show timing at which the respective FIFO memories 5-1, 5-2, and 5-3 read the audio data. The FIFO memories 5-1, 5-2, and 5-3 read the audio data at a generating timing of the clock signals S2 from the AES input processing circuit 1-1 (specifically, at an outputting timing of audio data at the Phase-Master side channel).

A read position thereof is set to a phase in which the phase of the input audio data for the Phase-Master side channel (that is, uppermost column of the figure) is delayed by ½ frame period=½ fs (10.4 µsec if the sampling frequency of the inputted AES signal is 48 kHz).

If the operation of the FIFO memory 5 discords between the phase of the audio data detected from the inputted AES signal AESI1 and the phases of the audio data detected from the inputted AES signals AESI2 or AESI3 within a range of ±½ fs, the phases of the audio data inputted into respective SRCs can be aligned.

Thus, sampling frequency conversion processing can be performed on the multi-channel audio signals for a certain number of channels (three channels for FIG. 3 and FIG. 5) such that the phases of the channels are respectively matched one another by phase-synchronized operation according to the sample rate converter having the Matched-Phase mode processing as shown in FIG. 3 and FIG. 5.

Recently, various surround methods such as 5.1 ch (Dolby Digital) and 7.1 ch (Dolby Digital Plus) (Dolby is registered trademark) have been used in a field of digital broadcasting, and the like. Hence, multi-channel audio signals of various numbers of channels can be inputted to one sample rate converter instead of fixed number of channels.

In order to perform sampling frequency conversion on the multi-channel audio signals of various numbers of channels as described above, it may be necessary to change to assign to which channel of the SRCs to perform phase-synchronized operation corresponding to the number of channels of input multi-channel audio signals.

However, since the channels of the SRCs for phase-synchronized operation have already fixed (first channel SRC 4-1 used as Phase-Master, and second and third channels SRCs 4-2 and 4-3 as Slaves) in the sample rate converters having the configurations shown in FIG. 3 and FIG. 5, the multi-channel assignment may not be changed flexibly.

In view of the problem described above, the inventors of the present invention have recognized a need to flexibly change to assign to which channels of sampling frequency conversion circuits are phase-synchronized can be changed in accordance with the number of channels of input multi-channel signals in a sampling frequency conversion apparatus having sampling frequency conversion circuits of a plurality of channels.

According to an embodiment of the present invention, there is provided a sampling frequency conversion apparatus having sampling frequency conversion circuits for a plurality of channels which respectively output phase information detected from inputted digital signals. The sampling frequency conversion apparatus also includes a processor which performs the following operation based on supplied setting information to set any two or more channels of the sampling frequency conversion circuits for a plurality of channels as channels to be phase-synchronized. The processor supplies the phase information outputted from the sampling frequency conversion circuit for one of the sampling frequency conversion circuits for two or more channels to the sampling frequency conversion circuits for the remaining channels of the sampling frequency conversion circuits for two or more channels, and operates the sampling frequency conversion circuits for the remaining channels in synchronization with the phase information.

In the sampling frequency conversion apparatus, based on the supplied setting information to set any two or more channels of the sampling frequency conversion circuits for a plurality of channels as the channels to be phase-synchronized. The phase information that is outputted from the sampling frequency conversion circuit for one channel of the sampling frequency conversion circuits for two or more channels is supplied to the sampling frequency conversion circuits for the remaining channels of the sampling frequency conversion circuits for two or more channels. The sampling frequency conversion circuits for the remaining channels then operate in synchronization with the phase information. As a result, the phase-synchronized operation is performed at the sampling frequency conversion circuits for two or more channels.

Further, assigning (multi-channel assignment) to which channels of sampling frequency conversion circuits are set in phase-synchronized operation can be easily changed only by changing the contents of setting information to be supplied.

Accordingly, assigning to which channels of sampling frequency conversion circuits are set in phase-synchronized operation can be flexibly changed in accordance with the number of channels of the input multi-channel signals in the sampling frequency conversion apparatus having the sampling frequency conversion circuits for a plurality of channels.

Next, a signal switching apparatus according to an embodiment of the present invention includes input processing circuits for a plurality of channels to respectively input digital signals, output processing circuits for a plurality of channels to respectively output digital signals, and a switching circuit to switch a connection relation between the input processing circuit for each channel and the output processing circuit for each channel. In addition, the signal switching apparatus includes sampling frequency conversion circuits, each of which performs sampling frequency conversion on digital signals inputted into the input processing circuit for each channel, and the sampling frequency conversion circuit for each channel outputs phase information detected from the inputted digital signals. The signal switching apparatus further includes an operation unit, a setting information generator, and a processor. The operation unit sets any two or more channels of the sampling frequency conversion circuits for a plurality of channels as the channels to be phase-synchronized. The setting information generator generates setting information to show a setting result by the operation unit. The setting information generated by the setting information generator is supplied to the processor. The processor supplies the phase information outputted from the sampling frequency conversion circuit for one channel of the sampling frequency conversion circuits for two or more channels set on the basis of the setting information to the sampling frequency conversion circuits for the remaining channels of the sampling frequency conversion circuits for two or more channels, and operates the sampling frequency conversion circuits for the remaining channels in synchronization with the phase information.

In the signal switching apparatus, each channel includes the sampling frequency conversion circuit. In addition, the operation unit is provided in order to set any two or more channels of the sampling frequency conversion circuits for a plurality of channels as the channels to be phase-synchronized.

When a user sets any two or more channels by the operation unit, setting information to show the setting result is generated. Further, phase information is outputted when detected from the input digital signals by the sampling frequency conversion circuit for each channel based on the setting result. In the phase information described above, the phase information that is outputted from the sampling frequency conversion circuit for one channel of the sampling frequency conversion circuits for two or more channels is supplied to the sampling frequency conversion circuits for the remaining channels of the sampling frequency conversion circuits for two or more channels. The sampling frequency conversion circuits for the remaining channels then operate in synchronization with the phase information. As a result, the phase-synchronized operation is performed at the sampling frequency conversion circuits for the two or more channels.

The user can easily change to assign (multi-channel assignment) to which channels of the SRCs to perform phase-synchronized operation by changing the contents of setting of the operation unit.

Accordingly, if the sampling frequency conversion circuit is provided to each input channel of the signal switching apparatus, assigning (multi-channel assignment) to which channel of the SRCs to perform phase-synchronized operation can be flexibly by changing the contents of setting of the operation unit in accordance with the number of channels of the inputted multi-channel signals.

The sampling frequency conversion apparatus according to the embodiment of the present invention can exhibit an effect that assigning to which channels of sampling frequency conversion circuits are set in the phase-synchronized operation can flexibly be changed in accordance with the number of channels of the inputted multi-channel signals in the sampling frequency conversion apparatus having the sampling frequency conversion circuits for a plurality of channels.

The signal switching apparatus according to the embodiment of the present invention can exhibit an effect that assigning to which channels of sampling frequency conversion circuits are set in the phase-synchronized operation can flexibly be changed in accordance with the number of channels of the inputted multi-channel signals by the user's operation when the sampling frequency conversion circuit is provided to each input channel of the signal switching apparatus.

BRIEF DESCRIPTION OF THE DRAWINGS

FIG. 9 is a diagram showing a phase synchronization channel setting GUI screen of GUI portion of FIG. 8; and FIG. 10 is a diagram showing a configuration example of another sample rate converter to which an embodiment of the present invention is applied.

DESCRIPTION OF THE PREFERRED EMBODIMENTS

Figure 5:
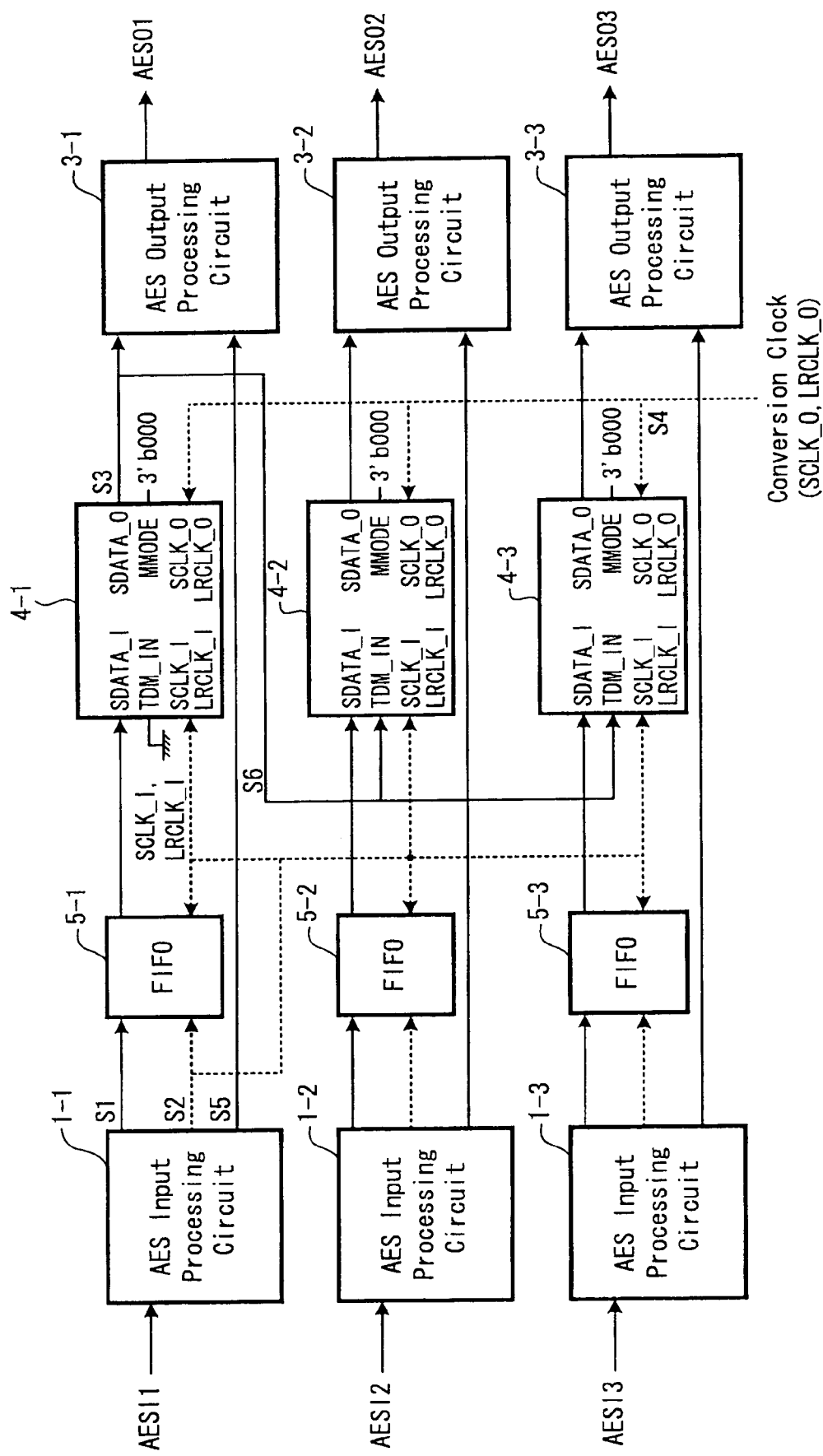
FIG. 5 is a diagram showing an example of an improved configuration of the sample rate converter of FIG. 3.
Figure 7:
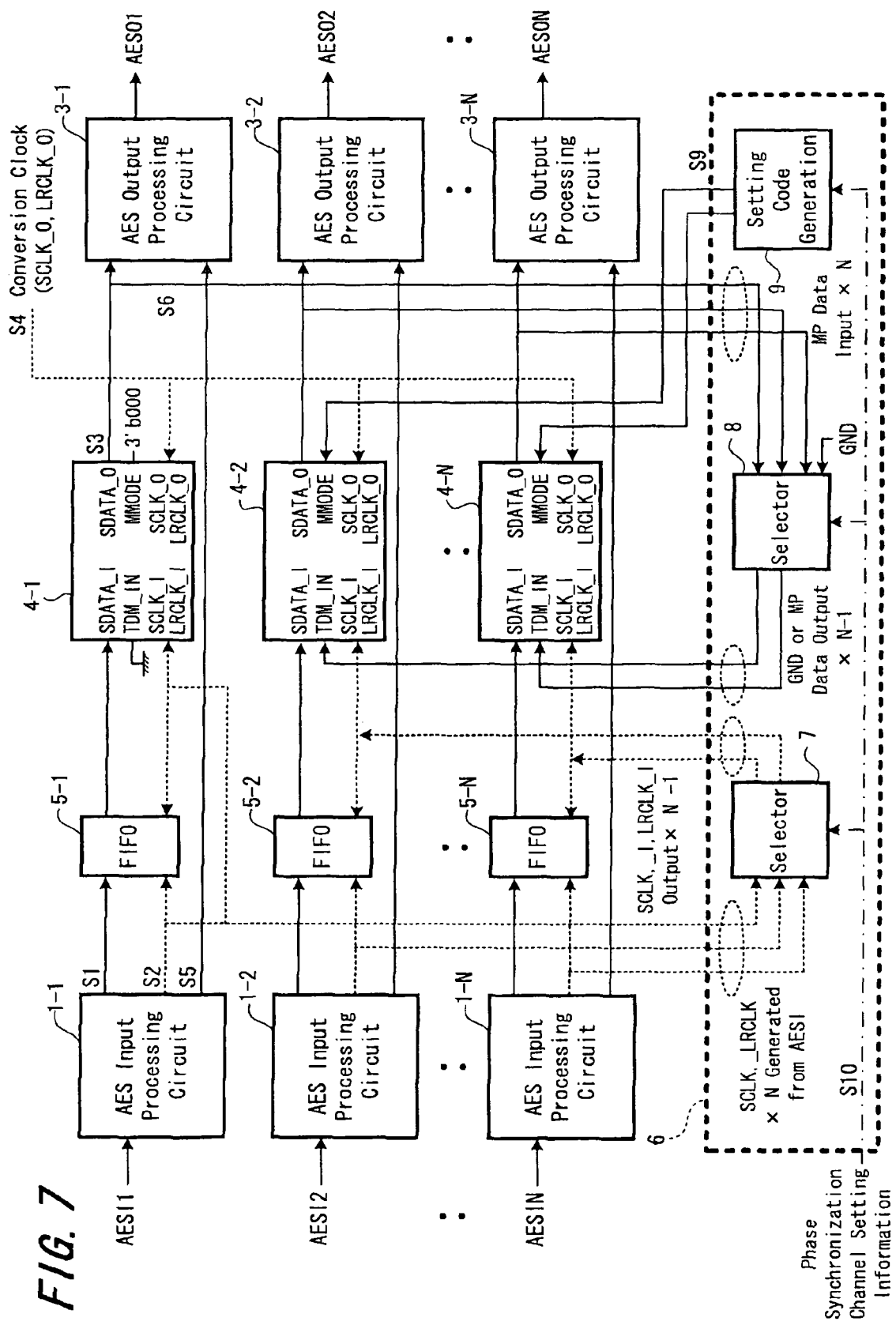
FIG. 7 is a diagram showing a configuration example of a sample rate converter to which an embodiment of the present invention is applied.

An embodiment of the present invention will be described in detail by way of example in the drawings. FIG. 7 is a diagram showing one configuration example of a sampling frequency conversion apparatus (sample rate converter) to which an embodiment of the present invention is applied. The entire configuration including elements identical to those of FIG. 5 will be described by referring to the same reference numerals.

The sample rate converter performs sampling frequency conversion on digital audio signals of AES/EBU format (hereinafter, referred to as AES signals), and AES input processing circuits 1-1, 1-2, - - - 1-N, FIFO memories 5-1, 5-2, - - - 5-N, SRCs (Sample Rate Converter IC) 4-1, 4-2, - - - 4-N, and AES output processing circuits 3-1, 3-2, - - - 3-N are provided corresponding to inputted AES signals (AESI1, AESI2, - - - AESIN (N indicates an integer such as 32)) of respective channels (hereinafter, circuits for-respective channels are generically referred to as AES input processing circuit 1, FIFO memory 5, SRC 4, AES output processing circuit 3, and the like).

In addition, an MP (Matched-Phase mode) operation setting circuit 6 is provided to the sample rate converter. The MP operation setting circuit 6 includes a selector 7 for N inputs and (N−1) outputs, a selector 8 for (N+1) inputs and (N−1) outputs, and an MMODE setting code generation circuit 9.

Figure 1:
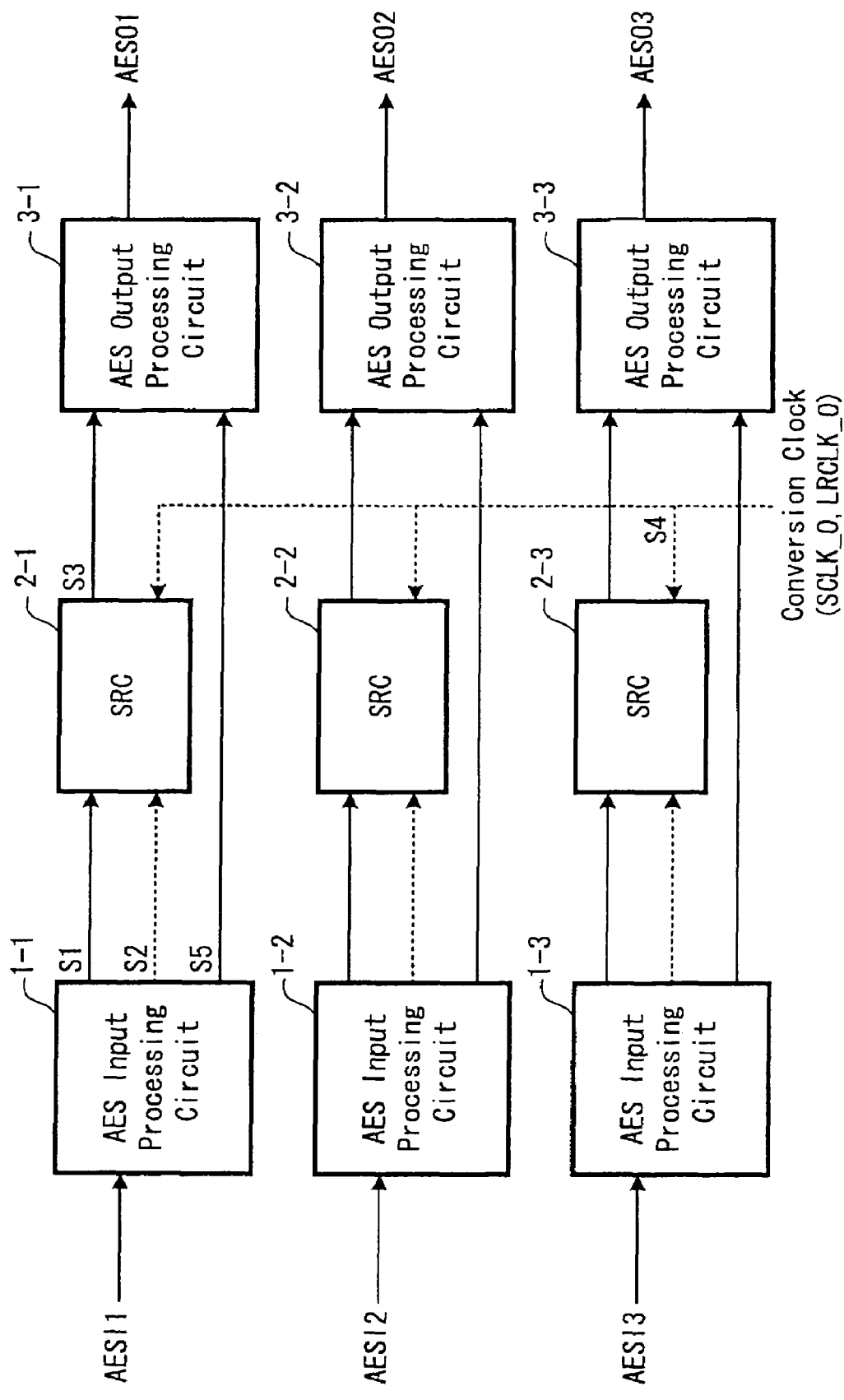
FIG. 1 is a diagram showing a configuration example of a sample rate converter in the related art.
Figure 2:
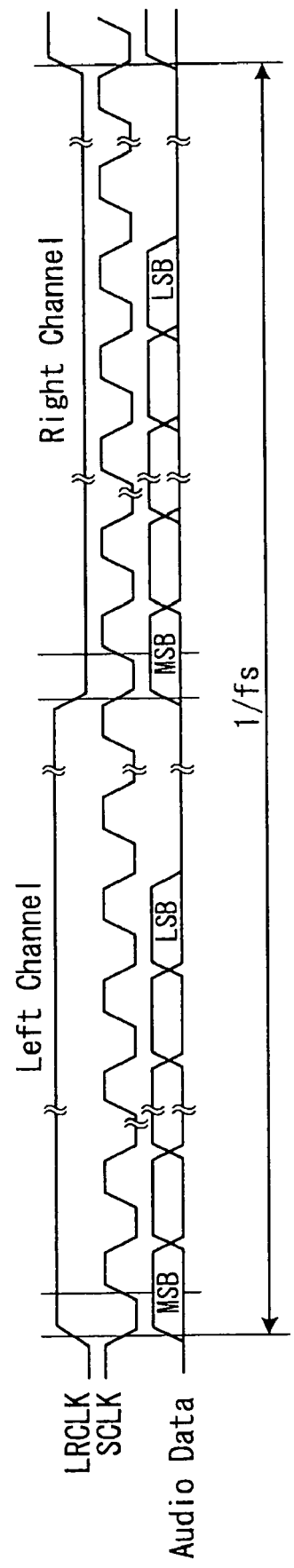
FIG. 2 is a diagram showing clock signals SCLK_I and LRCLK_I which are sampled from AES signals.
Figure 3:
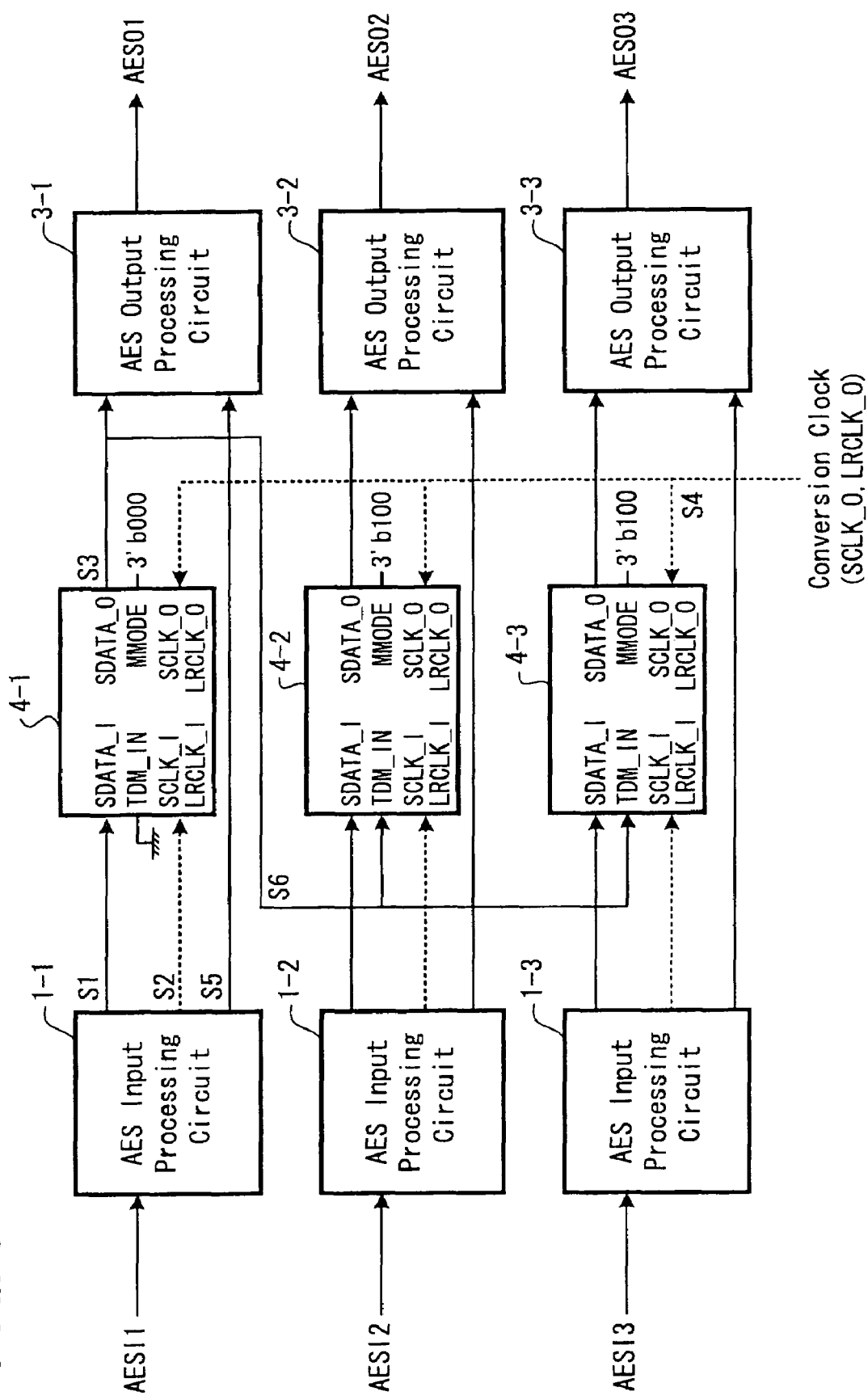
FIG. 3 is another diagram showing a configuration example of a sample rate converter in the related art.

The AES input processing circuit 1 includes the following circuit blocks (1) to (3):

(1) A circuit which samples clock signals from waveforms of inputted AES signals (2) A circuit which demodulates audio data from inputted AES signals (3) A circuit which samples ancillary data such as audio channel status bits from inputted AES signals Demodulated audio data S1 and sampled clock signals S2 (SCLK_I, LRCLK_I) (refer to FIG. 2) are supplied from the AES input processing circuits 1-1, 1-2, - - - 1-N to the respective FIFO memories 5-1, 5-2, - - - 5-N as write clock signals.

The sampled ancillary data S5 are supplied from the AES input processing circuits 1-1, 1-2, - - - 1-N to the respective AES output processing circuits 3-1, 3-2, - - - 3-N.

The sampled clock signals S2 (SCLK_I, LRCLK_I) in the AES input processing circuit 1-1 are supplied to the FIFO memory 5-1 as the read clock signals and simultaneously supplied to the SRC 4-1.

Further, the clock signals S2 (SCLK_I, LRCLK_I) sampled by the AES input processing circuits 1-1, 1-2, - - - 1-N are all inputted into the N input terminals of the selector 7 in the MP operation setting circuit 6.

Output signals from the (N−1) output terminals of the selector 7 are supplied to the FIFO memories 5-2, - - - 5-N of the second channel to the Nth channel as the read clock signals, and simultaneously supplied to the SRCs 4-2, - - - 4-N of the second channel to the Nth channel.

The FIFO memories 5-1, 5-2, - - - 5-N write the audio data S1 using the clock signals S2 (SCLK_I, LRCLK_I) supplied from the respective AES input processing circuits 1-1, 1-2, - - - 1-N as the write clock signals.

Furthermore, the FIFO memory 5-1 reads the audio data supplied from the AES input processing circuit 1-1 using the clock signals S2 (SCLK_I, LRCLK_I) as the read clock signals, and FIFO memories 5-2, - - - 5-N read the audio data using the clock signals supplied from the selector 7 in a manner described later as the read clock signals.

The audio data read from the FIFO memories 5-1, 5-2, - - - 5-N are supplied to the respective SRCs 4-1, 4-2, - - - 4-N.

The TDM_IN terminal of SRC 4-1 is grounded, and the code 3'b000 (setting code showing to be Phase-Master) is constantly supplied to the MMODE terminal of SRC 4-1. The SRC 4-1 is fixed as the Phase-Master in the Matched-Phase mode processing.

Figure 4:
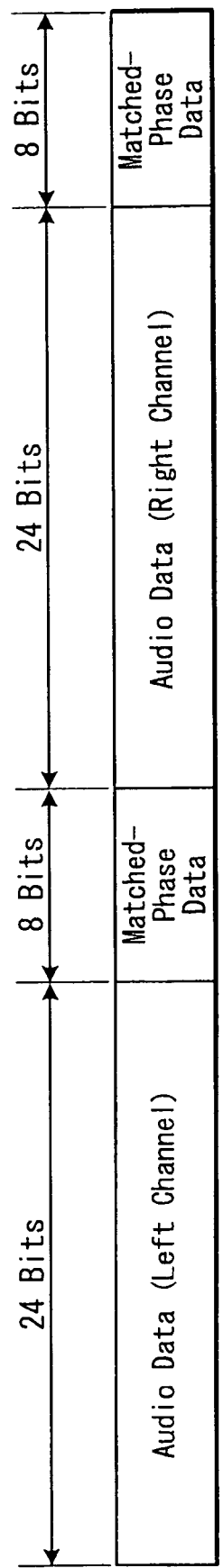
FIG. 4 is a diagram showing audio data multiplexed with Matched-Phase data.

The SRC 4-1 performs sampling frequency conversion on the audio data supplied from the FIFO memory 5-1 in synchronization with phase information detected from the audio data using the clock signals S2 (SCLK_I, LRCLK_I) supplied from the AES input processing circuit 1-1 and the internal sampling frequency conversion reference clock signals S4 (SCLK_O, LRCLK_O) of the apparatus. Further, the SRC 4-1 multiplexes the phase information (Matched-Phase data) with the audio data on which sampling frequency conversion is performed (see FIG. 4) and outputs the multiplexed data.

Meanwhile, the Matched-Phase data or data having GND (ground) level is supplied to the TDM_IN terminals of SRCs 4-2, - - - 4-N in a manner as described later from the selector 8 in the MP operation setting circuit 6. In addition, one of the code 3'b000 (setting code indicating Phase-Master) and the code 3'b100 (setting code indicating be Slave) is supplied to the MMODE terminals of SRCs 4-2, - - - 4-N from the MMODE setting code generation circuit 9 in the MP operation setting circuit 6 in a manner as described later.

If the code 3'b100 is supplied to the respective SRCs 4-2, - - - 4-N, the sampling frequency conversion is performed on the respective audio data supplied from the FIFO memories 5-2, - - - 5-N in synchronization with the Matched-Phase data supplied to the TDM_IN terminals using the clock signals supplied from the selector 7 and the internal sampling frequency conversion reference clock signals S4 (SCLK_O, LRCLK_O) of the apparatus in a manner as described later. Further, the audio data on which sampling frequency conversion is performed is outputted.

If the code 3'b000 is supplied to the respective the SRCs 4-2, - - - 4-N, the sampling frequency conversion is performed on the respective audio data supplied from the FIFO memories 5-2, - - - 5-N in synchronization with the phase information detected from the audio data using the clock signals supplied from the selector 7 and the internal sampling frequency conversion reference clock signals S4 (SCLK_O, LRCLK_O) of the apparatus in a manner as described later. The SRCs 4-2, - - - 4-N multiplex the phase information (Matched-Phase data) with the audio data on which the sampling frequency conversion is performed, and outputs the multiplexed data.

The audio data S3 on which sampling frequency conversion is performed by the SRCs 4-1, 4-2, - - - 4-N are supplied respectively to the AES output processing circuits 3-1, 3-2, - - - 3-N.

The AES output processing circuits 3-1, 3-2, - - - 3-N convert the audio data S3 and ancillary data S5 into original AES signals, and outputs the AES signals (AESO1, AESO2, - - - AESON).

The Matched-Phase data S6 outputted from the SRCs 4-1, 4-2, - - - 4-N are all inputted into N input terminals of the (N+1) input terminals of the selector 8 in the MP operation setting circuit 6. The data having GND (ground) level is inputted into the remaining one input terminal of the selector 8.

Output signals of the (N−1) output terminals with the selector 8 are supplied to the TDM_IN terminals of the SRCs 4-2, - - - 4-N for the second channel to the Nth channel.

The MP operation setting circuit 6 operates based on "phase synchronization channel setting information" provided thereto. The phase synchronization channel setting information is used for setting any two or more channels of the SRCs 4-1 to 4-N of the first channel to the Nth channel as phase synchronization channels.

The selector 7 selects the clock signals S2 (SCLK_I, LRCLK_I) from the AES input processing circuit 1 of the channel having the smallest channel number of two or more channels set on the basis of the phase synchronization channel setting information, and supplies the clock signals to the SRCs 4 for two or more channels and the FIFO memories 5 (excluding the SRC 4-1 and FIFO memory 5-1 of the first channel).

The selector 8 selects the Matched-Phase data S6 from the SRC 4 of the channel having the smallest channel number of two or more channels set on the basis of the phase synchronization channel setting information, and supplies the Matched-Phase data to the TDM_IN terminals of the SRCs 4 for the remaining channels. In addition, the selector 8 selects the data having GND (ground) level, and supplies the data to the TDM_IN terminal of the SRC 4 for the smallest channel (excluding the SRC 4-1 of the first channel).

The MMODE setting code generation circuit 9 provides the code 3'b000 (setting code indicating Phase-Master) to the MMODE terminal of the SRC 4 for the channel having the smallest channel number (excluding the SRC 4-1 of the first channel) of the SRCs for two or more channels set on the basis of the phase synchronization channel setting information, and supplies the code 3'b100 (setting code showing to be Slave) to the MMODE terminals of the SRCs 4 of the remaining channel.

Accordingly, the SRC 4 for the channel having the smallest channel number (including the SRC 4-1 that is fixed as the Phase-Master) of the SRC 4 for two or more channels set on the basis of the phase synchronization channel setting information performs sampling frequency conversion processing in synchronization with the phase information detected by the SRC 4 itself, and the SRCs 4 for the remaining channels perform sampling frequency conversion processing in synchronization with the phase information (Matched-Phase data) detected by the SRC 4 for the smallest channel. As a result, the SRCs 4 for two or more channels can operate in synchronization with the phase information.

Further, assigning (multi-channel assignment) to which channels of the SRCs 4 to perform phase-synchronized operation is only changed by changing the phase synchronization channel setting information supplied to the MP operation setting circuit 6.

Specifically, if the phase synchronization channel setting information set to first to third channels is supplied, for example, the first to third SRCs 4 (three channels) can perform phase-synchronized operation (SRC 4-1 acts as Phase-Master, and SRCs 4-2 and 4-3 act as Slaves).

In addition, if the phase synchronization channel setting information set to third to eighth channels is supplied, for example, the third to eighth SRCs 4 (six channels) can perform phase-synchronized operation (SRC 4-3 as Phase-Master, and SRCs 4-4 to 4-8 as Slaves).

Accordingly, in a sample rate converter having N channels of the SRCs 4 (e. g., thirty-two channels), assigning to which channels of the SRCs 4 to perform phase-synchronized operation can be flexibly changed in accordance with the channel number of the input multi-channel audio signals (for example, 5.1 ch surround or 7.1 ch surround) by changing the phase synchronization channel setting information supplied to the MP operation setting circuit 6.

Figure 6:
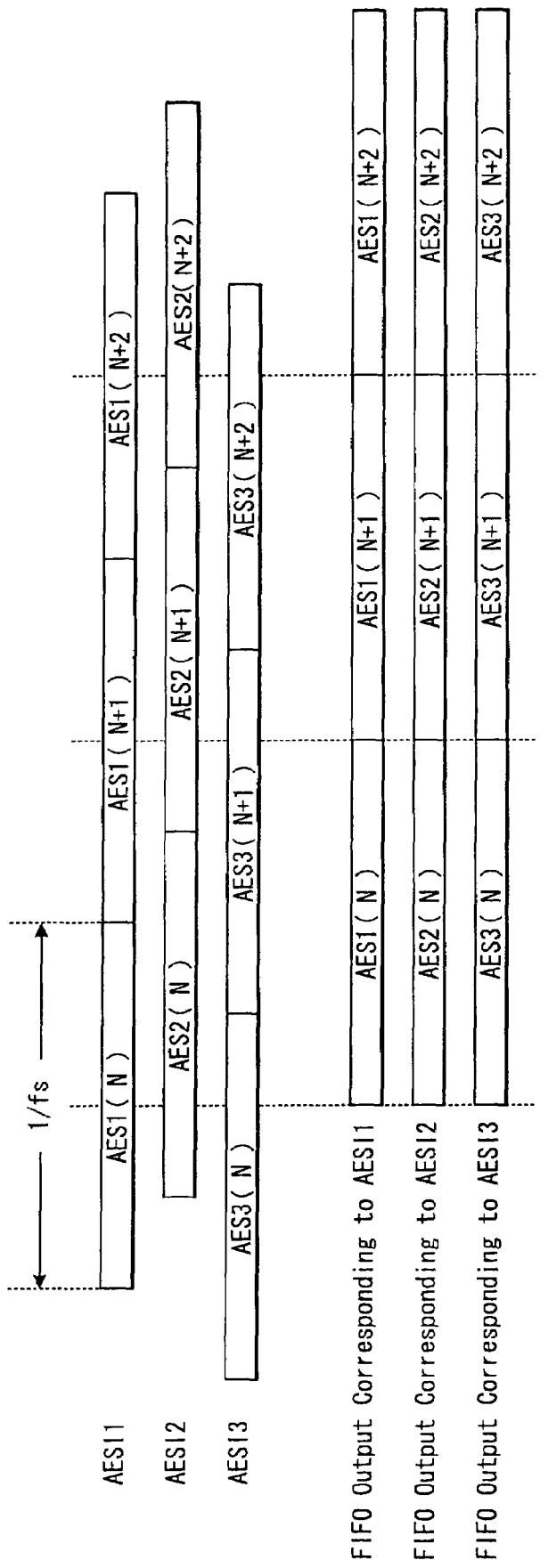
FIG. 6 is a diagram showing operation timing of a FIFO memory of FIG. 5.

Further, the audio data are read from the FIFO memories 5 of the two or more channels using the clock signals S2 as shown in FIG. 6 as the read clock signals, which are sampled by the AES input processing circuit 1 of the channel having the smallest channel number (channel in which SRC 4 acts as Phase-Master) of two or more channels set on the basis of the phase synchronization setting information.

Therefore, the phases of the audio data inputted to the SRC4 for the two or more channels can be aligned by mitigating phase differences, if there are differences in lengths between the AES signals AESI1 to AESIN transmission cables, or if there are differences in processing time delays between the AES input process circuits 1; thereby exhibiting a sufficient phase synchronization performance.

Next, an example in which the sample rate converter shown in FIG. 7 is applied to an audio signal routing switcher; that is, a device used for broadcasting service, will be described. The routing switcher is an apparatus that inputs signals of a plurality of channels (audio signals from a microphone, VTR, etc.), and switches the audio signals to output to corresponding devices (program transmission apparatus, editing apparatus, or the like).

Figure 8:
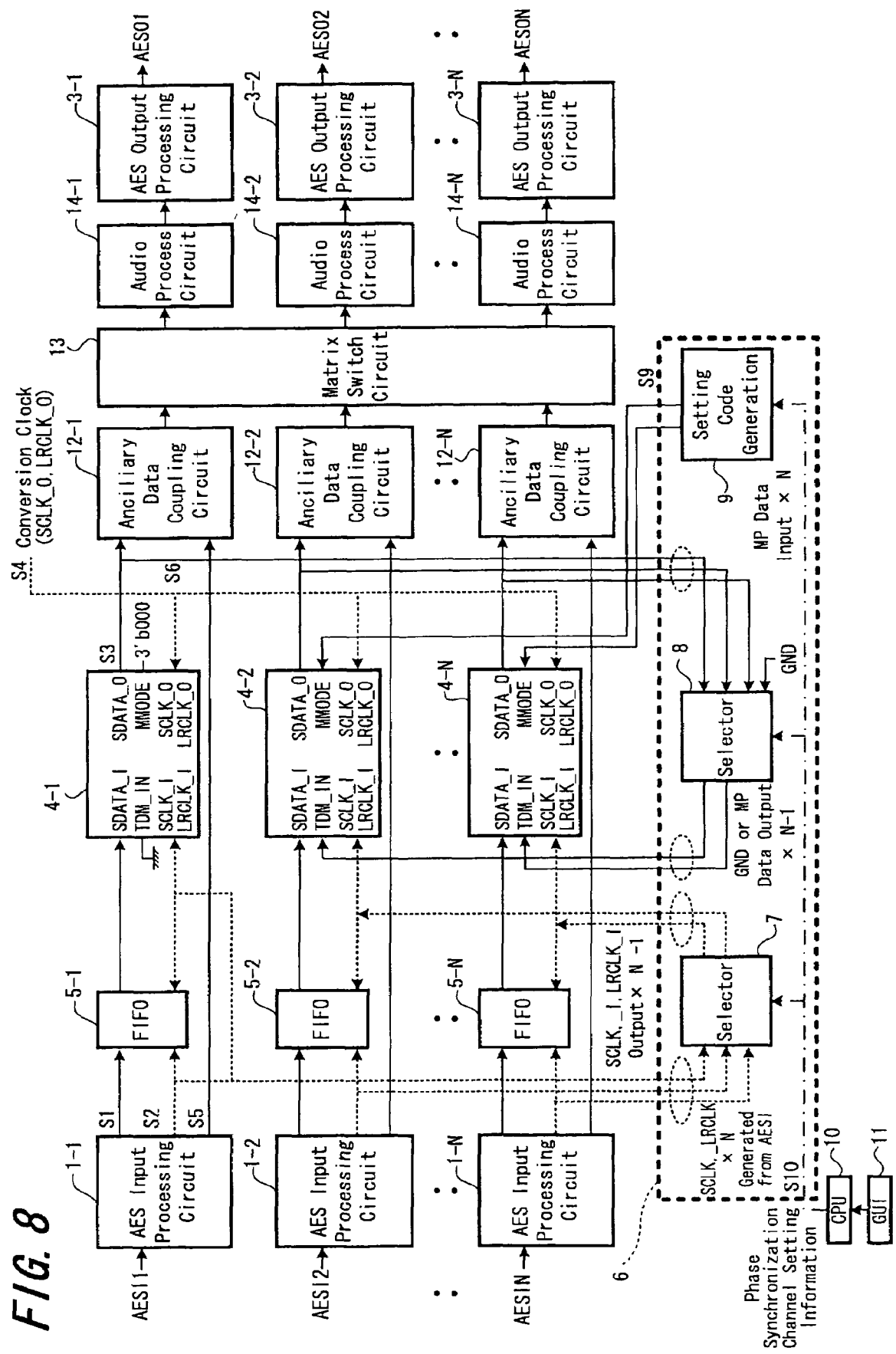
FIG. 8 is a diagram showing a configuration example of a routing switcher on which the sample rate converter of FIG. 7 is installed.

FIG. 8 is a diagram showing a configuration example of a routing switcher on which the sample rate converter shown in FIG. 7 is installed. In the FIG. 8, the elements identical to those in FIG. 7 are provided with the same reference numerals, and description thereof are thus omitted.

In the routing switcher, the following circuits (1) to (3) are respectively provided between the SRCs 4-1, 4-2, - - - 4-N and AES output processing circuits 3-1, 3-2, - - - 3-N for respective channels shown in FIG. 7:

(1) Ancillary data coupling circuits for respective channels 12-1, 12-2, - - - 12-N

(2) Matrix switch circuit 13

(3) Audio processing circuits for respective channels 14-1, 14-2, - - - 14-N

Here, the ancillary data S5 sampled by the AES input processing circuit 1 is supplied to the ancillary data coupling circuit 12 instead of the AES output processing circuit 3. The ancillary data coupling circuit 12 couples the ancillary data with the audio data supplied from the SRC 4 and transmits the audio data to the matrix switch circuit 13.

The matrix switch circuit 13 includes a plurality of input signal lines intersected with a plurality of output signal lines, and a connection switch (semiconductor element) provided at each intersected point. A connection relation (output destination of AES signals) between the AES input processing circuit 1 for corresponding channel and the AES output processing circuit 3 for corresponding channel is switched on or off using a connection switch. The audio data from the ancillary data coupling circuit 12 for corresponding channel is inputted into the input signal line. The audio data outputted from the output signal line is supplied to the audio processing circuit 14 for corresponding channel.

The audio processing circuit 14 performs digital signal processing such as level adjustment, filter, emphasis, and soft switching (processing to reduce a noise by fading out sound immediately before switching at the matrix switch circuit 13, and fading in the sound immediately after switching). The audio data is inputted to the ancillary data coupling circuits 12 for corresponding channels. The audio data processed by the audio processing circuit 14 is supplied to the AES output processing circuit 3.

It should be noted that only the routing switcher for N channels is shown in FIG. 8; however, in practice, the routing switcher includes a plurality of input slots (for example, eight slots) having the AES input processing circuits 1 for N channels, FIFO memories 5, SRCs 4, and ancillary data coupling circuits 12. likewise, the routing switcher includes a plurality of output slots (for example, eight slots) having audio processing circuits 14 for N channels and AES output processing circuits 3. Further, a connection relation (output destinations of AES signals inputted into all input slots) between all the channels in the input slots and all the channels in the output slots is switched by one matrix switch circuit 13.

The routing switcher further includes a GUI portion 11. The GUI portion 11 is an operation unit for a user to perform various setting of the routing switcher on a GUI (Graphical User Interface) screen. The GUI portion 11 includes a display and an input device such as a keyboard and a mouse.

The phase synchronization channel setting (any two or more channels of the SRCs 4-1, 4-2, - - - 4-N of the first to Nth channels shown in FIG. 8 are set as the phase-synchronization channels) is also included in setting items according to the GUI portion 11. FIG. 9 is a diagram showing a GUI screen for the phase synchronization channel setting.

INPUT, SLOT3, SLOT4, SLOT7, SLOT8, SLOT11, SLOT12, SLOT15, and SLOT16 in vertical columns at the left side of the GUI screen indicate slot numbers of the eight input slots provided to the routing switcher (slot numbers of the output slots are indicated as 1, 2, 5, 6, 9, 10, 13, and 14).

(1-16) and (17-32) at the right side of SLOT 3 indicate channel numbers 1 to 32 of 32 channels of the input slot of slot number 3. (33-48) and (49-64) at the right side of SLOT 4 indicate channel numbers 33 to 64 of 32 channels of the input slot of slot number 4. Thereafter, a channel number of the input slots of each slot number is indicated in a similar manner, and (225-240) and (241-256) at the right side of last SLOT 16 indicate channel numbers 225 to 256 of 32 channels in the input slot of slot number 16.

A setting column is provided at the right side of the channels (1-16), (17-32) to (225-240), and (241-256) for setting channels to be phase-synchronized. Numerals of 1, 2, - - - 16 are arranged in a horizontal direction at an upper end of the setting column. The rows along the line with the (1-16) row positioned directly below each numeral of 1, 2, - - - 16 indicate respective positions channel numbers 1, 2, - - - 16; those with the row (17-32) indicate respective positions of channel numbers 17, 18, - - - 32; those with the row (33-48) indicate respective positions of channel numbers 33, 34, - - - 48, - - - ; and those with the row (241-256) are positions of channel numbers 241, 242, - - - 256.

A method of setting a phase synchronization channel with the GUI screen is described as follows. First, a relevant channel number position in the setting column is clicked with a mouse to select a channel number to operate the SRC 4 (FIG. 8) (that is, to convert the sampling frequency of the audio signals) from eight input slots for a total of 256 channels, and the clicked position is marked with a symbol "*" (alternatively, the symbol "*" may be typed in using a keyboard).

In FIG. 9, the symbols "*" are provided to positions of the third to fifth, ninth to eleventh, and 21st channels of SLOT 3 (channel numbers 3 to 5, 9 to 11, and 21), positions of the fifteenth to eighteenth channels of SLOT 4 (channel numbers 47 to 50), and positions of the sixth to eighth, eleventh, and twelfth channels (channel numbers 70 to 72, 75, and 76).

Subsequently, the mouse is dragged over positions of channel numbers of two or more channels subject to phase-synchronization of positions for mutually adjacent channel numbers of the slots along the line with the same slot number, and positions to which the symbols "*" are respectively provided. Then, an symbol "= =" is displayed between the symbols "*" and in a connecting manner (alternatively, the symbol "= =" may be typed in between the symbols "*" and "*" using the keyboard).

In FIG. 9, "= =" is displayed such that the positions of the third to fifth channels (channel numbers 3 to 5) of SLOT 3 are connected. In addition, the symbol "= =" is displayed such that the positions of the fifteenth to eighteenth channels (channel numbers 47 to 50) of SLOT 4 are connected. Likewise, the symbol "= =" is displayed such that the positions of the eleventh and twelfth channels (channel numbers 75 and 76) of SLOT 7 are connected.

Accordingly, the following settings are completed:

the setting of the SRCs 4 for channel numbers 3 to 5 to operate in phase-synchronization, the setting of the SRCs 4 for channel numbers 47 to 50 to operate in phase-synchronization, and the setting of the SRCs 4 for channel numbers 75 and 76 to operate in phase-synchronization are completed.

It should be noted that a column of FREQ at the lower side of the setting column is used for selecting from 48 kHz, 96 kHz, and 192 kHz for respective input slots as the sampling frequency at the SRC 4 after conversion. In the column, whenever a position directly below a desired slot number of SLOT 3, SLOT 4, SLOT 7, SLOT 8, SLOT 11, SLOT 12, SLOT 15, or SLOT 16 arranged in the horizontal direction is clicked with the mouse, selection result displaying the sampling frequency for the input slot of the slot number is switched in sequential order of 48 kHz, 96 kHz, 192 kHz, and 48 kHz by a toggle operation.

Accordingly, after designating the SRC 4 to be operated, setting the phase synchronization channel, and selecting the sampling frequency, an "S" key is pressed on the keyboard so that signals indicating the specification result, setting result, and selection result are transmitted from the GUI portion 11 to a CPU 10 (FIG. 8) that controls the whole routing switcher.

The CPU 10 generates phase synchronization channel setting information such as those described hereinbefore based on the setting result of the phase synchronization channel, and supplies that phase synchronization channel setting information to the MP operation setting circuit 6.

In addition, based on those specification result of the SRC 4 and selection result of the sampling frequency, the CPU 10 controls ON or OFF of the operation of each SRC 4 and the sampling frequency after the sampling frequency conversion in each SRC 4 to be operated (control signals from CPU 10 to SRC 4 is omitted, and thus not shown in FIG. 8).

According to this routing switcher, the user can easily change to assign (multi-channel assignment) to which channels of SRCs 4 are phase-synchronized by changing the contents of setting on the GUI screen of FIG. 9. Therefore, if the sampling frequency conversion circuit is provided to each input channel of the routing switcher, assigning to which channels of sampling frequency conversion circuits are phase-synchronized can be flexibly changed by the user's operation on the GUI screen in accordance with the number of channels of the inputted multi-channel audio signals (for example, depending on 5.1 ch surround, or 7.1 ch surround).

Last, an example to which a protection circuit to protect the sample rate converter shown in FIG. 7 from an inadequate input audio signals is added is shown in FIG. 10 as another configuration example of the sample rate converter to which an embodiment of the present invention is applied. In the FIG. 10, the elements identical to those in FIG. 7 are provided with the same reference numerals, and description thereof are thus omitted.

In the sample rate converter, a frequency measurement circuit 15 which measures the sampling frequency of the audio data on inputted AES signals is added to the AES input processing circuit 1 for each channel.

In addition, a mask circuit 16 is provided to a signal path to transmit the phase synchronization channel setting information to the selectors 7, 8, and MMODE setting code generation circuit 9 in the MP operation setting circuit 6. Further, signals indicating a measurement result of the sampling frequency are supplied to the mask circuit 16 from the frequency measurement circuit 15 in the AES input processing circuit 1 for each channel.

Of those measurement results, the mask circuit 16 mutually compares the measurement results between the frequency measurement circuits 15 for the channels which have been set to be phase-synchronized with the phase synchronization channel setting information. Further, if the measurement results mutually match, the inputted phase synchronization channel setting information is directly outputted and supplied to the selectors 7, 8 and MMODE setting code generation circuit 9.

In contrast, the mask circuit 16 generates independent operation setting information to independently operate the SRCs 4 for the channels when the measurement results do not mutually match (the independent operation setting information is used as setting information for setting such that the clock signals S2 (SCLK_I, LRCLK_I) from the AES input processing circuits 1 of own channels are respectively supplied to the FIFO memories 5 and SRCs 4 of those channels through the selector 7, the Matched-Phase data respectively outputted from the own SRCs 4 are supplied to the SRCs 4 of the channels through the selector 8, and the code 3'b000 (setting code showing to be the Phase-Master) is supplied from the MMODE setting code generation circuit 9 to the SRCs 4 of those channels). Further, the inputted phase synchronization channel setting information is masked (covered) with the independent operation setting information, and the independent operation setting information is supplied to the selectors 7, 8 and MMODE setting code generation circuit 9.

The reason for adding such frequency measurement circuit 15 and mask circuit 16 includes the following reasons. Since the Matched-Phase mode processing is used for performing those sample rate converters having the mutually equivalent sampling frequencies of the input audio signals in the phase-synchronized operation, the sampling frequency conversion processing is performed based on a wrong parameter when those sample rate converters having different sampling frequencies of the input audio signals are set in phase-synchronized operation.

Therefore, if the user wrongly sets two or more channels to the different sampling frequencies of the input audio signals on the phase synchronization channel setting GUI screen of FIG. 9, the sampling frequency conversion processing is performed based on the wrong parameter in the SRCs 4 for the respective channels having the configuration shown in FIG. 7.

In contrast, if the setting has been inaccurate, the Matched-Phase mode processing can be terminated to independently operate the SRCs 4 for the respective channels only by adding those frequency measurement circuit 15 and mask circuit 16. As a result, the sampling frequency conversion processing with the wrong parameter may be avoided.

It should be noted that if the sampling frequencies of the input audio signals for respective channels are measured and the measurement results for the respective channels set to be phase-synchronized do not mutually match, the SRCs 4 for the channels are independently operated in the example of FIG. 10. However, an alternative thereto or in addition thereto, it is also possible to detect from factors other than the sampling frequency as to whether or not inadequate audio signals are inputted into the channels set to be phase-synchronized. If the inadequate audio signals are inputted, the SRCs 4 for the respective channels are independently operated.

Examples of the factors other than the sampling frequency include the presence or absence of supplied audio signals (disconnection of a cable for transmitting the audio signals, and disconnection of a power supply to an apparatus on the supply side of the audio signals), a demodulation result of the audio data at the AES input processing circuit 1 (such as a case that the demodulation is not performed normally due to the absence of PLL lock), a parity check result at the AES input processing circuit 1.

In the embodiment described hereinbefore, the MP operation setting circuit 6 sets the SRC 4 having the smallest channel number of the SRCs 4 having two or more channels as the Phase-Master set on the basis of the phase synchronization channel setting information (first channel SRC 4-1 fixed as Phase-Master under such condition). However, the MP operation setting circuit 6 is not limited to thereto. The MP operation setting circuit 6 may include the SRC 4 for an appropriate channel of the SRC 4 for two or more channels as the Phase-Master (in the first channel, the clock signals (SCLK_I, LRCLK_I) are supplied from the selector 7 to the FIFO memory 5 and the SRC 4, and the code is supplied from the MMODE setting code generation circuit 9 as the second channel to the Nth channel).

The channels of mutually adjacent channel numbers in the slots along the line with the same slot number are set as the channels to be phase-synchronized on the phase synchronization channel setting GUI screen shown in FIG. 9. However, the phase synchronization channel setting GUI screen is not limited thereto. In the phase synchronization channel setting GUI screen, the GUI portion 11 may display such a GUI screen that two or more channels of mutually distant channel numbers in the slots along the line with the same slot number are set as the channels to be phase-synchronized.

The sample rate converter shown in FIG. 7 is installed on the routing switcher of the embodiment shown in FIG. 8. However, the sample rate converter shown in FIG. 7 may be installed on an apparatus to input audio signals of a plurality of channels (for example, audio mixer) other than the routing switcher.

Furthermore, FIG. 7 shows the sample rate converter for the AES signals. However, the sampling frequency conversion apparatus according to the embodiment of the present invention may be applied to the apparatus to which digital audio signals other than the AES signals, or digital signals other than the digital audio signals are inputted insofar as the sampling frequency conversion apparatus is suitable for a plurality of channels.

It should be understood by those skilled in the art that various modifications, combinations, sub-combinations and alterations may occur depending on design requirements and other factors insofar as they are within the scope of the appended claims or the equivalents thereof.

What is claimed is:

1. A sampling frequency conversion apparatus having sampling frequency conversion circuits for a plurality of channels, comprising:
   a detector which detects phase information of digital signals inputted to the sampling frequency conversion circuit for each channel;
   an input section which inputs setting information for the sampling frequency conversion circuits for two or more channels to be phase-synchronized of the sampling frequency conversion circuits for the plurality of channels;
   a phase information supplier which supplies the phase information for the sampling frequency conversion circuit for a specific channel of the sampling frequency conversion circuits for the two or more channels designated by the setting information inputted into the input section to the sampling frequency conversion circuits for the remaining channels of the sampling frequency conversion circuits for the two or more channels other than the sampling frequency conversion circuit for the specific channel;
   a sampling frequency converter which performs sampling frequency conversion based on the phase information of the sampling frequency conversion circuits for the remaining channels in synchronization with the phase information for the specific channel supplied from the phase information supplier;
   a selector which selects the specific channel based on the inputted phase information detected by the detector for each channel;

a first code generator which directs the sampling frequency conversion circuit for the specific channel to operate in synchronization with the phase information of the specific channel detected by the detector; and a second code generator which directs the sampling frequency conversion circuits for the remaining channels to operate in synchronization with the phase information supplied by the selector.

2. The sampling frequency conversion apparatus according to claim 1, wherein the phase information includes Matched-Phase data for Matched-Phase mode processing, the first code generator supplies a code indicating "Phase-Master" to the sampling frequency conversion circuit for the specific channel, and the second code generator supplies a code indicating "Slave" to the sampling frequency conversion circuits for the remaining channels.

3. The sampling frequency conversion apparatus according to claim 1, further comprising:

a memory unit which temporarily stores input signals connected to a preceding phase of the sampling frequency conversion circuit for each channel;

a write clock supplier which supplies clock signals sampled from the input signals for each channel to the memory unit for each channel as write clock signals;

a read clock supplier which supplies selected clock signals to the memory units for two or more channels, with the selected clock signals being determined by selecting the clock signals for the specific channel based on the setting information of the clock signals sampled from the inputted signals for each channel; and a conversion clock supplier which supplies the read clock signals to the sampling frequency conversion circuits for the two or more channels as sampling frequency conversion clock signals.

4. The sampling frequency conversion apparatus according to claim 1, further comprising:

a frequency measurement circuit which measures a frequency of inputted digital signals for each channel at a preceding phase of the sampling frequency conversion circuit; and a controller which independently operates the sampling frequency conversion circuits for the two or more channels, provided that measurement results of the frequency measurement circuits for the two or more channels are incongruent with one another.

5. A signal switching apparatus including input processing circuits for a plurality of channels which input digital signals, output processing circuits for a plurality of channels which output digital signals, and a switching circuit which switches connections between the input processing circuit for each channel and the output processing circuit for each channel, the signal switching apparatus comprising:

a sampling frequency conversion circuit which converts digital signals inputted to the input processing circuit for each channel into a sampling conversion frequency;

a detector which detects phase information from the digital signals inputted to the sampling frequency conversion circuit for each channel;

an operation unit which sets the sampling frequency conversion circuits for two or more channels of the sampling frequency conversion circuits for the plurality of channels as phase synchronization channels;

a setting information generator which generates setting results indicated by the operation unit;

a phase information supplier which supplies phase information of the sampling frequency conversion circuit for a specific channel of the sampling frequency conversion circuits for the two or more channels designated by the setting information generated from the setting information generator to the sampling frequency conversion circuits for the remaining channels;

a sampling frequency converter which performs sampling frequency conversion based on the phase information of the channels supplied from the phase information supplier in synchronization with the supplied phase information of the specific channel;

a selector which selects the specific channel based on the inputted phase information detected by the detector for each channel;

a first code generator which directs the sampling frequency conversion circuit for the specific channel to operate in synchronization with the phase information of the specific channel detected by the detector; and a second code generator which directs the sampling frequency conversion circuits for the remaining channels to operate in synchronization with the phase information supplied by the selector.

6. The signal switching apparatus according to claim 5, wherein the operation unit selects channel numbers of two or more channels to be phase-synchronized from the channel numbers of the plurality of the channels displayed on a screen.

7. The signal switching apparatus according to claim 5, wherein the phase information includes Matched-Phase data for Matched-Phase mode processing, the first code generator supplies a code indicating "Phase-Master" to the sampling frequency conversion circuit for the specific channel, and the second code generator supplies a code indicating "Slave" to the sampling frequency conversion circuits for the remaining channels.

8. The signal switching apparatus according to claim 5, further comprising:

a memory unit which temporarily stores input signals connected to a preceding phase of the sampling frequency conversion circuit for each channel;

a write clock supplier which supplies clock signals sampled from the input signals for each channel to the memory unit for each channel as write clock signals;

a read clock supplier which supplies selected clock signals to the memory units for two or more channels, with the selected clock signals being determined by selecting the clock signals for the specific channel based on the setting information of the clock signals sampled from the inputted signals for each channel; and a conversion clock supplier which supplies the read clock signals to the sampling frequency conversion circuits for the two or more channels as sampling frequency conversion clock signals.

9. The signal switching apparatus according to claim 5, further comprising:

a frequency measurement circuit which measures a frequency of inputted digital signals for each channel in the input processing circuit; and a controller which independently operates the sampling frequency conversion circuits for the two or more channels, provided that measurement results of the frequency measurement circuits for the two or more channels are incongruent with one another.

* * * * *